United States Patent [19]

Rydel

[11] Patent Number: 5,043,710
[45] Date of Patent: Aug. 27, 1991

[54] KEY MAKING USE OF THE PROPERTIES OF A LIQUID CRYSTAL

[75] Inventor: Charles Rydel, Paris, France

[73] Assignee: Jaeger, Levallois Perret, France

[21] Appl. No.: 361,122

[22] Filed: Jun. 5, 1989

[30] Foreign Application Priority Data

Jun. 8, 1988 [FR] France ............................. 88 07625

[51] Int. Cl.$^5$ .................. G09G 3/02; G09G 3/36; G09G 1/26
[52] U.S. Cl. ........................... 340/712; 340/711; 340/765; 340/784; 340/794
[58] Field of Search ............... 341/22, 33; 340/712, 340/765, 767, 707; 84/699, 720, 711; 178/19

[56] References Cited

U.S. PATENT DOCUMENTS

| | | | |
|---|---|---|---|
| 4,176,575 | 12/1979 | Munch | 341/33 |
| 4,224,615 | 9/1980 | Penz . | |
| 4,290,061 | 9/1981 | Serrano | 341/33 |
| 4,291,303 | 9/1981 | Cutler et al. | 340/712 |
| 4,680,429 | 7/1987 | Murdock et al. | 340/712 |
| 4,694,279 | 9/1987 | Meno | 341/33 |
| 4,910,504 | 3/1990 | Eriksson | 341/33 |

FOREIGN PATENT DOCUMENTS

| | | |
|---|---|---|
| 0079711 | 5/1983 | European Pat. Off. . |
| 2555841 | 11/1983 | France ............................. 341/33 |
| 2138571 | 10/1984 | United Kingdom . |

OTHER PUBLICATIONS

Electronic Letters, vol. 8, No. 25/26, Dec., 1982, pp. 1106–1108; M. J. Bradshaw et al., "New Form of Liquid Crystal Touch Switch".

Review of Scientific Instruments, vol. 55, No. 1, Jan., 1984, pp. 79–87; F. I. Mopsi, "Precision Time–Domain Dielectric Spectrometer".

*Primary Examiner*—Ulysses Weldon
*Assistant Examiner*—S. Saras

[57] ABSTRACT

A touch sensor comprises a liquid crystal cell (10) and detector means (40, 50A, 50B) responsive to a change in the dielectric constant of the liquid crystal. The detector means comprise an HF electrical signal generator (40) together with integration means (50A, 50B) suitable for integrating the charge created by any change in the dielectric constant of the liquid crystal (14).

9 Claims, 2 Drawing Sheets

KEY MAKING USE OF THE PROPERTIES OF A LIQUID CRYSTAL

The present invention relates to touch sensors, i.e. to sensors or keys suitable for detecting finger pressure for the purpose of controlling an associated system.

BACKGROUND OF THE INVENTION

Numerous types of touch sensor or key have already been proposed.

In particular, as described in EP-A-0 079 711, GB-2 138 571, U.S. Pat. No. 4,224,615, and in an article by M. J. Bradshaw et al entitled "New form of liquid crystal touch switch," published in Electronic Letters, Vol. 8, No. 25/26, December 1982, pp. 1106–1108, proposals have been made for keys each comprising a liquid crystal cell which exhibits a change in capacitance on being subjected to a mechanical force, and which is connected in a detection bridge circuit in order to detect any such change in capacitance.

However, the devices described in the above-mentioned documents do not make it possible simultaneously to make use of the liquid crystal cells to provide a conventional display, at any rate not by using means which are cheap and simple.

The object of the present invention is to provide a touch sensor which makes use of the specific property of liquid crystals, in particular of helical nematic liquid crystals, whereby a mechanical force exerted on a helical nematic liquid crystal in the excited state gives rise to a temporary change in the disposition of its molecules and this gives rise to a considerable, but short-lasting change in its dielectric constant, while nevertheless enabling the liquid crystal cells to be used simultaneously in conventional manner for display purposes.

SUMMARY OF THE INVENTION

To do this, the present invention provides a touch sensor comprising a liquid crystal cell and detector means responsive to a change in the dielectric constant of the liquid crystal and comprising an HF electrical signal generator together with integration means suitable for integrating the charge created by any change in the dielectric constant of the liquid crystal.

BRIEF DESCRIPTION OF THE DRAWINGS

Embodiments of the invention are described by way of example with reference to the accompanying drawings, in which.

DETAILED DESCRIPTION

Figure 1:
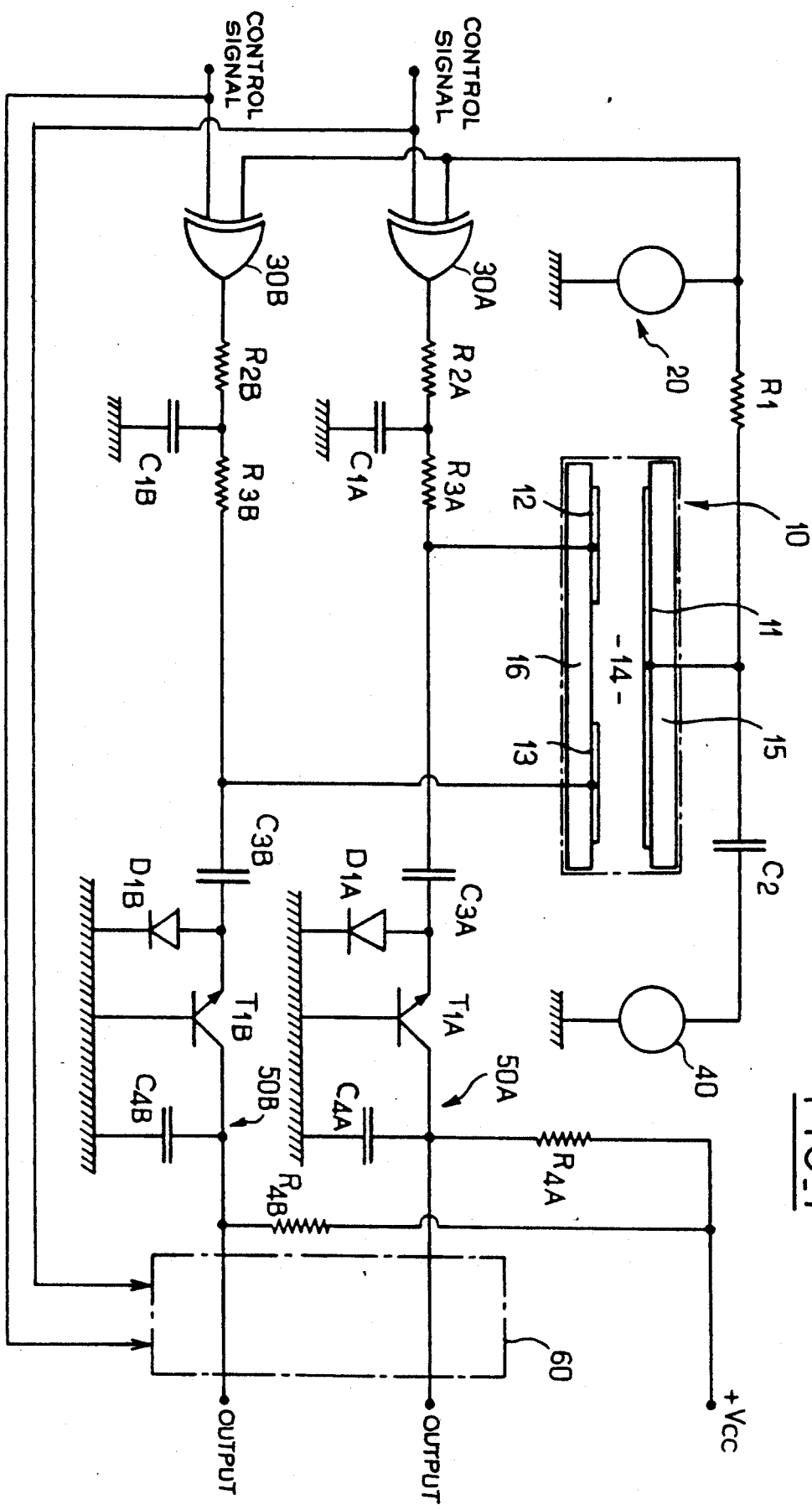
FIGS. 1 and 2 show two different embodiments of a device in accordance with the present invention.

The embodiment shown in accompanying FIG. 1 is described first.

In FIG. 1, reference 10 designates a diagrammatic representation of a conventional liquid crystal optical cell.

In conventional manner, the cell 10 comprises two glass plates 15 and 16 which are about 10 microns apart, for example. Glass plate 15 is provided on its inside face with a base electrode 11. The other glass plate 16, is provided on its inside face with control electrodes 12 and 13. FIG. 1 shows two control electrodes 12 and 13 in diagrammatic form on the inside face of glass plate 16. However, the present invention may be applied to liquid crystal optical cells including an arbitrary number of control electrodes on the inside face of glass plate 16. The present invention is applicable to a liquid crystal optical cell 10 having only one control electrode on the inside face of glass plate 16. The invention is also applicable to liquid crystal optical cells 10 having a large number of control electrodes 12, 13, on the inside face of the plate 16, as is commonly the case for liquid crystal display devices.

The liquid crystal 14 is placed between the glass plates 15 and 16. It is preferably constituted by a nematic liquid crystal.

The molecules of the liquid crystal lie parallel to the plates. However, generally orthogonal anchor directions can be defined between the plates 15 and 16 by subjecting them to an appropriate treatment, known per se. Thus, at rest, the molecules of the liquid crystal take up a helical configuration.

The helical configuration of the molecules can be destroyed merely by applying a tension of a few volts between the base electrode 11 and one of the control electrodes 12 or 13. While such a control tension is being applied, the molecules of the liquid crystal extend perpendicularly to the plates.

It is recalled that such a helical nematic liquid cyrstal optical cell is generally placed between two crossed light polarizers. In the absence of a control signal between the base electrode 11 and the control electrodes 12 and 13, the helical structure of the liquid crystal molecules causes the plane of polarization of the light passing therethrough to rotate through 90°. Light can therefore pass through both of the polarizers and the liquid crystal cell. However, when the helix is destroyed by applying a control signal, the two crossed polarizers prevent light from passing.

The cell 10 used in the context of the present invention may be associated with such crossed polarizers. The touch sensor of the present invention is preferably integrated with a display screen. However, the above-mentioned crossed polarizers are not shown in the accompanying figures in order to simplify the drawing.

As mentioned above, the Applicant seeks to exploit the experimentally observed property of such a liquid crystal cell 10 whereby a mechanical force exerted perpendicularly to the plates 15 and 16 while the cell 10 is excited by a control signal gives rise to a temporary change in the disposition of the molecules and this is accompanied by a considerable, but short-term, change in the dielectric constant.

The means sensitive to a change in the dielectric constant of the liquid crystal 14 are essentially constituted by an electrical HF signal generator 40 and integration means 50 suitable for integrating the charge created by the change in the dielectric constant.

More precisely, in the context of the present invention, a fingerpress is detected by providing a single HF generator 40 together with as many integrator stages as the cell 10 has control electrodes 12, 13.

One of the terminals of the HF generator 40 is connected to ground. The other terminal of the generator 40 is connected to the base electrode 11 via a coupling capacitor C2.

The various integration stages are identical in structure. The components in the two integration stages shown in FIG. 1 and associated respectively with control electrode 12 and with control electrode 13 are given identical reference numerals together with respective indices A and B.

Each of the integration stages comprises a lowpass filter 50A or 50B connected to the associated control electrode 12 or 13 via a common-base transistor T1A or T1B.

In the embodiment shown in the accompanying figures, the lowpass filters 50A and 50B are each constituted by a resistor R4A or R4B and a capacitor C4A or C4B connected in series between a positive supply terminal +Vcc and circuit ground. The resistors R4A and R4B are connected to the positive supply terminal +Vcc and the capacitors C4A and C4B are connected to circuit ground.

The bases of transistor T1A and T1B are connected to circuit ground. The collectors of transistors T1A and T1B are connected to the midpoints of respective ones of the lowpass filters 50A and 50B.

The emitters of transistors T1A and T1B are connected via respective coupling capacitors C3A and C3B to the respective associated control electrodes 12 and 13.

Finally, respective diodes D1A and D1B are connected between circuit ground and respective common points between the coupling capacitors C3A and C3B and the emitters of the associated transistors T1A and T1B. More precisely, the anode of each diode D1A or D1B is connected to the emitter of the associated transistor T1A or T1B, whereas the cathode of the diode is connected to circuit ground.

The capacitance of the coupling capacitors C3A and C3B must be large compared with the capacitance of the capacitor constituted by the liquid crystal 14 in association with the electrodes 11, 12, and 13 in order to transmit changes in charge created by changes in the dielectric constant of the liquid crystal, while nevertheless blocking the D.C. component.

The capacitance of the coupling capacitors C3A and C3B is preferably not less than ten times the capacitance of the capacitor formed by the liquid crystal 14.

During each cycle of the signal from the HF generator 40, and while the output potential from the generator 40 is increasing, the capacitor charges via associated diode D1A or D1B. Thereafter, during each cycle, and while the output potential from the generator is decreasing, the potential stored across the terminals of the capacitor causes the associated transistor T1A or T1B to conduct.

Each of the lowpass filter integration stages 50A and 50B thus transforms changes in the capacitance of the liquid crystal 14 into changes in the current flowing through resistor R4A or R4B. These changes in current $\delta I$ are given by the equation:

$$\delta I = C \cdot [V - (V_{be} + V_d)] F$$

where:
C represents change in the capacitance of the liquid crystal 14;
V represents the peak charging voltage of the capacitor C4A or C4B;
$V_{be}$ represents the voltage drop between the base and the emitter of the transistor T1A or T1B when in the conducting state;
$V_d$ represents the voltage drop across the terminals of the diode D1A or D1B in the conducting state; and
F represents the frequency of the HF generator 40.

By way of non-limiting example, the generator 40 may generate an electrical signal of amplitude V equal to 5 volts peak-to-peak and at a frequency F of about 128 kHz.

The liquid crystal 14 contained between the base electrode 11 and the control electrodes 12 and 13 is excited in conventional manner by means of a logic control signal superposed on a low frequency alternating component in order to avoid electrolyzing the liquid crystal 14. Here again, a single generator 20 is provided for generating the above-mentioned low frequency alternating component, together with as many control stages as there are control electrodes 12 or 13 on the glass plate 16. The various control stages are identical in structure. The components of the two control stages shown in the accompanying figures are given identical reference numerals together with respective indices A and B.

The generator 20 has a first terminal connected to circuit ground. Its second terminal is connected via a coupling resistor R1 to the base electrode 11.

Each control stage comprises an exclusive-OR logic gate 30A or 30B, together with a lowpass filter.

The second terminal of the generator 20 is connected to a first input of each of the logic gates 30A and 30B. The second inputs to the gates 30A and 30B receive control signals specific to respective ones of the associated control electrodes 12 and 13.

The outputs from the logic gates 30A and 30B are connected to the corresponding electrodes 12 and 13 via the above-mentioned lowpass filters. Each of these filters comprises two resistors R2A & R3A or R2B & R3B together with a corresponding capacitor C1A or C1B. The two resistors R2A & R3A or R2B & R3B are connected in series between the output from the logic gate 30A or 30B and the corresponding control electrode 12 or 13. The capacitors C1A and C1B are connected between circuit ground and the common point between the associated pair of resistors R2A & R3A or R2B & R3B.

The generator 20 may deliver a squarewave signal, for example, between 0 volts and 5.6 volts and at a frequency of about 60 Hz. The lowpass filters provided at the outputs of the logic gates 30A and 30B serve to attenuate transmission of the signal fronts at 60 Hz delivered by the generator 20. The lowpass filters preferably have a time constant of more than one millisecond.

In conventional manner, the molecules of the liquid crystal 14 take up a helical configuration when the control signal applied to the second input of logic gates 30A or 30B is at a low level. In this case, the base electrode 11 is at the same potential as the control electrodes 12 or 13. In contrast, the helical configuration of the liquid crystal is destroyed when the above-mentioned control signal is at the high level. In this excited state, a mechanical force applied to the cell 10 perpendicularly to the glass plates 15 and 16 over one of the control electrodes 12 or 13 gives rise to a temporary disorganization of the molecules in the liquid crystal over the control electrode under consideration, thereby giving rise to a short-term localized change in the dielectric constant. By integrating the charge created in this way, a pulse signal is induced at the output from the lowpass filters 50A or 50B.

In other words, as shown in FIG. 1, and assuming that the electrodes 12 or 13 are spaced far enough apart, the application of mechanical force to the cell over electrode 12 gives rise to a pulse signal at the output of filter 50A, whereas the application of mechanical force of the cell over electrode 13 gives rise to a pulse signal at the output of filter 50B.

However, it may be observed that the change in the disposition of the molecules in the liquid crystal induced by applying a control signal also gives rise to a change in the dielectric constant and consequently also gives rise to an output signal from the lowpass filters 50A and 50B.

As a result, it is desirable to provide a logic circuit at the output from the sensor as shown diagrammatically under reference numeral 60, with the logic circuit serving to discriminate between the signals detected at the outputs of filters 50A and 50B due to mechanical force being applied to the cell 10 and the signals detected at the outputs of the filters 50A and 50B resulting from a change in the state of the input control signals.

In other words, the output logic circuit 60 is designed to enable the corresponding sensor output whenever a pulse signal appears at the output of a filter 50A or 50B in the absence of any change in state of the associated control signal.

The lowpass filter for integrating the charge generated by the change in the dielectric constant of the liquid crystal advantageously has a time constant of about 10 milliseconds.

The circuit shown in FIG. 1 is effective at detecting mechanical force being applied to cell 10. However, it should be observed that the operating point of the circuit shown in FIG. 1 varies as a function of the capacitance of the liquid crystal 14 in the cell.

Figure 2:
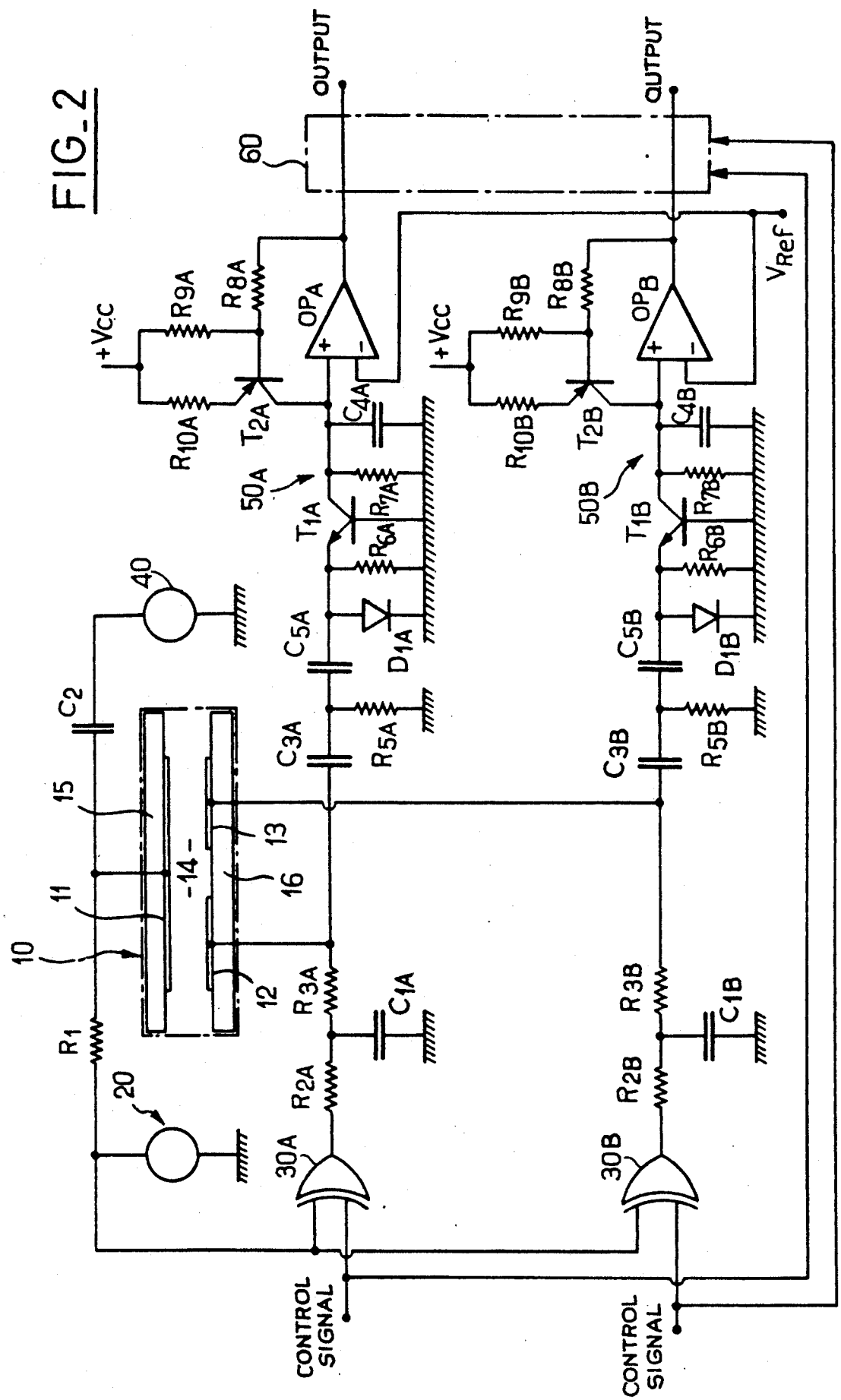

The circuit shown in FIG. 2 avoids such variation in the neutral point and consequently allows a single electronic detection circuit to be used with various different liquid crystal cells 10.

FIG. 2 shows the same cell 10, HF generator 40, coupling capacitor C2, LF generator 20, coupling resistor R1, logic gates 30A and 30B, lowpass filters R2A, R3A, C1A, and R2B, R3B, C1B, coupling capacitors C3A and C3B, diodes D1A and D1B, transistors T1A and T1B, and output logic circuit 60. These components are therefore not described in detail below.

The circuit of FIG. 2 differs from that shown in FIG. 1 essentially by the use of respective controlled current sources placed in series with the resistors in the lowpass integration filters.

These current sources are constituted by respective PNP transistors T2A and T2B each controlled by a respective signal which is proportional to the difference between a common reference signal and the output of the corresponding filter.

Each control signal is generated by a respective operational amplifier OPA or OPB. The non-inverting input of each operational amplifier is connected to the output of the lowpass filter performing integration, i.e. to the collector of the corresponding transistor T1A or T1B. The inverting input of each operational amplifier OPA and OPB receives a reference signal VRef. Respective control signals are obtained at the outputs of the operational amplifiers OPA and OPB. Each operational amplifier output is connected to the base of the corresponding transistor T2A or T2B via a coupling resistor R8A or R8B. The bases of the transistors T2A and T2B are also connected to a positive supply terminal +Vcc via respective bias resistors R9A and R9B. The emitters of transistors T2A and T2B are connected to the same positive supply terminal +Vcc via respective resistors R10A and R10B. Finally, the collectors of transistors T2A and T2B are connected to the common points between capacitors C4A or C4B and the collectors of transistors T1A or T1B.

In outline, the controlled current sources operate as follows: if the voltage on the collectors of transistors T1A or T1B tends to go down, then the output voltage of the corresponding comparator also goes down and the current generated by the corresponding source T2A or T2B goes up.

The circuit shown in accompanying FIG. 2 also differs from that shown in FIG. 1 by the presence of respective highpass filters between the coupling capacitors C3A and C3B and the transistors T1A and T1B. The purpose of these highpass filters is to improve rejection of the 60 Hz low frequency alternating component from the generator 20. These highpass filters comprise resistors R5A or R5B and capacitors C5A or C5B. The capacitors C5A and C5B are connected in series with the corresponding coupling capacitors C3A or C3B and the emitters of the corresponding transistors T1A or T1B. The resistors R5A and R5B are connected between circuit ground and the corresponding common points between capacitors C3A & C5A or C3B & C5B.

As mentioned above, the present invention makes it possible to integrate touch sensors directly in a liquid crystal display. Consequently, it makes it possible to eliminate mechanical sensors, thereby simultaneously improving system reliability and ergonomics. These characteristics are particularly important when making equipment suitable for mounting on self-propelled vehicles.

Naturally the present invention is not limited to the particular embodiments described above, but extends to any variant coming within the scope of the claims.

The above description relates to using nematic liquid crystals. However, the present invention can be used with any other type of liquid crystal that exhibits a change in dielectric constant when subjected to a mechanical force.

I claim:
1. A touch sensor, comprising:
    a liquid crystal cell including two glass plates, a base electrode provided on an inside face of a first one of said two glass plates, and a plurality of control electrodes provided on an inside face of a second one of said two glass plates;
    logic control means for controlling said liquid crystal cell, said logic control means comprising a plurality of logic gates having their outputs connected to the control electrodes, and a generator generating a low frequency electrical signal, the output of said generator being connected to said base electrode and to a first input of each of said logic gates, a second input of each logic gate being coupled to a respective control input to receive a respective control logic signal, and
    detector means coupled to the liquid crystal cell for responding to a change in the dielectric constant of the liquid crystal, said detector means comprising:
    HF electrical signal generating means having outputs connected between said base electrode and ground;
    a plurality of integration stages each comprising a low-pass filter including a resistor and a capacitor, said capacitor being connected between ground and an input of the integration stage, said resistor being connected between the input of the integration stage and a voltage supply terminal, said input of each integration stage being connected to a respective control electrode so that said integration stages integrate the charges created by any change in the dielectric constant of the liquid crystal, and output logic circuit means sensitive to pulses generated between said capacitor and said resistor of the integration stages, said output logic circuit means receiving also the control logic signals applied to said logic control means for discriminating between a pulse output signal due to a change in the dielectric constant of the liquid crystal related to a mechanical force being applied to the cell and an output signal due to a change in the dielectric constant of the liquid crystal related to a change in the state of an input control signal.

2. A sensor according to claim 1 wherein said gates of the logic means are exclusive—OR logic gates.

3. A sensor according to claim 1 wherein low-pass filters are connected between the output of said gates of the logic control means and the control electrodes of the liquid crystal cell.

4. A sensor according to claim 1, wherein the detector means include a plurality of common-base transistors connected between the control electrodes of the liquid crystal cell and a respective input of the integration stages.

5. A sensor according to claim 4, wherein a diode is connected upstream from each transistor.

6. A sensor according to claim 1, including respective highpass filters upstream from the integration stages.

7. A sensor according to claim 1, including a controlled current source in each charge integration stages, each controlled current source being connected in series with said resistor of a respective low-pass filter.

8. A sensor according to claim 7, wherein each controlled current source is controlled by a signal proportional to the difference between a reference signal and the output from the associated integration stages.

9. A sensor according to claim 1, wherein the liquid crystal is a nematic liquid crystal.

* * * * *